July 14, 1959 A. W. HOLT ET AL 2,895,077

GAS DIODE LINEAR REGISTER

Filed May 4, 1956

INVENTORS
Arthur W. Holt
David C. Friedman
BY Arthur Vinograd ATTORNEY
Leonard F. Stoll AGENT 2,895,077
Patented July 14, 1959

2,895,077

GAS DIODE LINEAR REGISTER

Arthur W. Holt and David C. Friedman, Washington, D.C., assignors to the United States of America as represented by the Secretary of Commerce Application May 4, 1956, Serial No. 584,405

2 Claims. (Cl. 315—84.5)

Figures 1, 2:
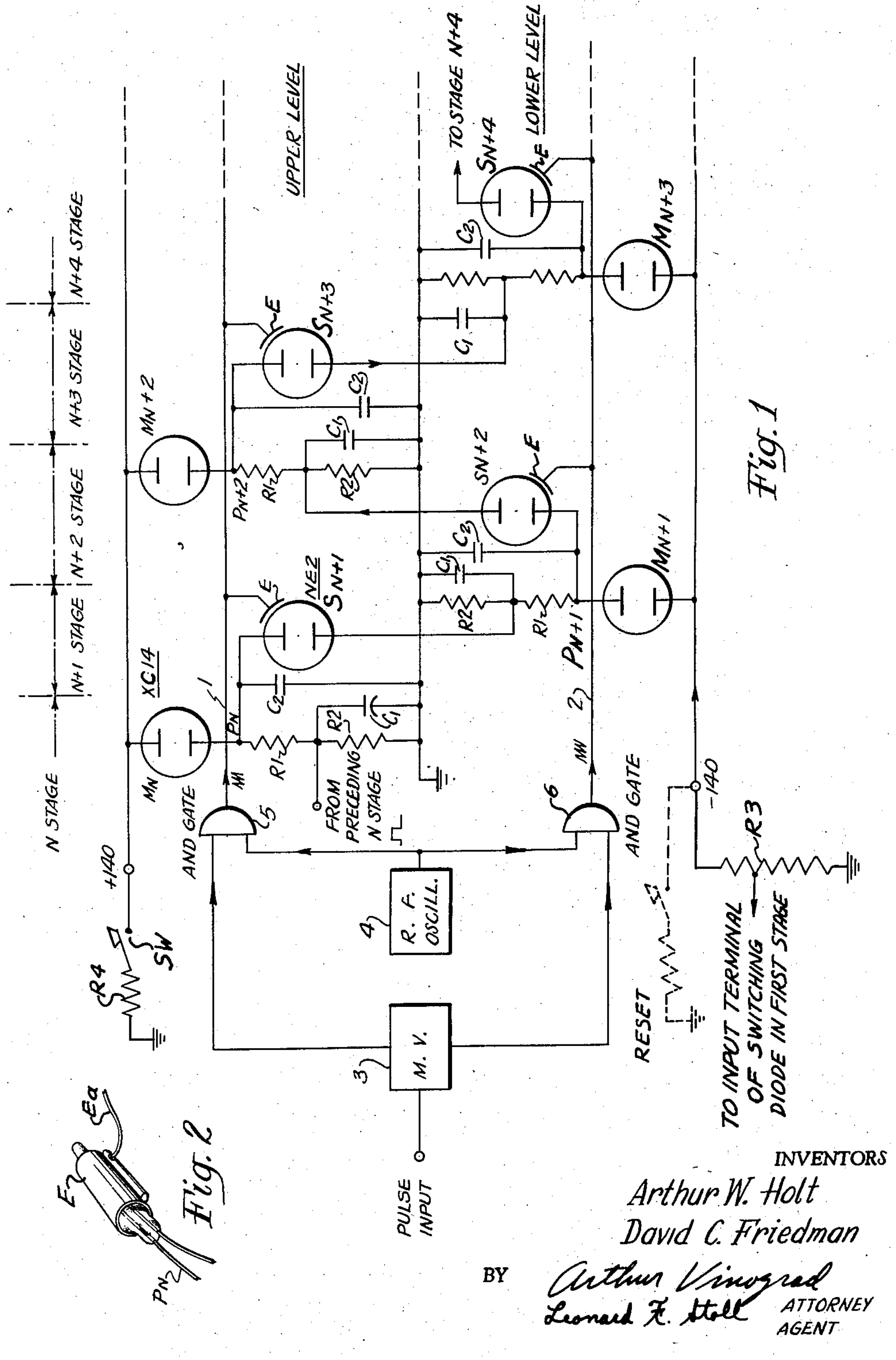

This invention relates to step-by-step circuits in which changes in the state or condition of a component circuit stage are used to manifest a count or other control function corresponding to the number of applications of discrete applied pulses. Such circuit has utility as a register or counting device, a pulse source or control circuit. The principles of the invention can be employed to construct a linear or bar type register of the type in which count indicating means are successively energized and remain energized.

It is accordingly an object of the present invention to provide a step-by-step pulse-registering circuit comprising a plurality of circuit stages in which a change of state of one stage is produced upon the application of R.-F. energy.

It is a further object of this invention to provide a step-by-step circuit comprising a plurality of circuit stages which are energized by the sequential application of R.-F. energy, according to a pattern indicative of the number of pulses applied to the circuit.

Other uses and advantages of the invention will become apparent upon reference to the specification and drawings in which:

Fig. 1 is a circuit schematic of one embodiment of the present invention and Fig. 2 is a representation of a gas-filled diode having auxiliary ionizing means, which is employed as a switching diode in accordance with the principles of this invention.

In accordance with the principles of this invention conduction of an indicator-storage gas diode having a suitable differential between striking and maintaining potentials is initiated by the application of an R.-F. oscillatory signal to an associated switching diode. The switching diode is a gaseous diode placed in a switchable R.-F. field which is strong enough to produce ionization of the tube. The storage and switching diodes are arranged according to a circuit pattern such that conduction of one indicator-storage diode permits energization of a subsequent indicator-storage diode. Each of the energized indicator-storage diodes may be left energized as the counting proceeds to form a linear or bar type register. In known gaseous tube step-by-step circuits, conduction of a stage "readies" a subsequent stage for conduction upon application of the next pulse to be counted. The subsequent stage, in other words, is biased to a threshold condition and the occurrence of a spurious signal could act to trigger inadvertently the stage and register a count.

In accordance with the principles of the present invention, a state-change of any stage requires the application of an ionizing potential of considerable amplitude which is initiated by the pulse to be counted. The system is therefore less easily affected by extraneous signals.

Fig. 1 shows the principles of this invention embodied in a linear or bar type register having a plurality of stages. An indicator-storage device M in each stage, which may be in the form of a gas-filled diode, is successively energized and remains energized as the count proceeds. Each stage of the register also includes a switching diode S in the form of a gas-filled diode having auxiliary ionizing means which is R.-F. energizable.

A typical switching diode of the type employed in the present invention is shown in Fig. 2. One embodiment of the switching diode S comprises a conventional NE–2 type tube to which a sleeve E of conducting material is applied. An electrode connector $E_a$ is soldered or suitably connected to the sleeve as shown. Alternately, a sheath of conducting foil, or a film of conducting material may be deposited on the surface of the tube in a known manner. Such construction permits the application of an R.-F. field to the gas diode which is strong enough to ionize the diode.

Fig. 1 shows three complete stages labeled $n+1$, $n+2$, and $n+3$ of a multistage step-by-step circuit constructed in accordance with the principles of the present invention. It is to be understood that as many subsequent stages as desired may be constructed by merely supplementing the circuit embodiment shown in Fig. 1 with additional stages. The connections for the preceding stage ($n$) and subsequent ($n+4$) stage are indicated.

Considering the $n+1$ stage for example, there is shown a switching diode labeled $S_{(n+1)}$ which is an NE–2 type diode incorporating an auxiliary sleeve E as described in connection with Fig. 2. One electrode of the switching diode $S_{(n+1)}$ has a terminal for receiving the output of the indicating diode $M_n$ comprising part of the preceding stage $n$, the other electrode of the switching diode $S_{(n+1)}$ is coupled to the junction between two resistors R1 and R2, respectively. The remaining terminal of the resistor R2 is connected to ground as indicated, while the opposite terminal of resistor R1 which is employed as a current limiting resistor for the indicator diode is connected to one electrode of the indicator diode $M_{(n+1)}$ of stage $n+1$ and to the input electrode of the switching diode $S_{(n+2)}$ for the subsequent stage $n+2$ of the circuit. By connecting the output electrode of the switching diode S to the junction of the resistors R1 and R2 in this manner, there is no low-impedance path possible through any diode regardless of the state of conduction of any of the diodes.

As is apparent in Fig. 1, adjacent stages of the step-by-step circuit are connected to biasing potentials of opposite polarity. That is, one electrode of each alternate stage indicator diode such as $M_n$ and $M_{(n+2)}$ is connected to a positive potential source designated as plus 140 volts in Fig. 1 while one electrode in each intermediate alternate stage such as the indicator diodes $M_{(n+1)}$ and $M_{(n+3)}$ is connected to a source of negative potential designated as minus 140 volts in the drawing. The amplitude of the biasing voltage is under the striking potential of the indicator-storage diode by an amount somewhat less than the minimum output voltage obtainable from the particular tube type used. The output signal comprises the difference between the bias potential and the tube maintaining potential. A suitable M diode is the Hivac XC–14 or XC–17 which has a nominal minimum striking potential of 145 volts and a nominal maintaining potential of 75 volts.

Similarly, separate means are provided for applying an R.-F. signal to the sleeves E of adjacent switching diodes. That is, the sleeve E for each alternate stage such as stages $n+1$ and $n+3$ are connected to conductor 1 which is connected to an R.-F. source 4 through an And-gate 5 while the sleeves E on each of the intermediate alternate switching diode stages $n+2$ and $n+4$, for example, are connected through line 2 to the R.-F. source through an And-gate 6.

The And-gates 5 and 6 are conventional coincidence devices which will conduct upon concurrent application of input signals to provide an output on the associated conductors 1 or 2. For further description of a typical And-gate such as may be employed with the present invention, attention is directed to a pamphlet entitled, "Symbolic Logic, Binary Calculation, and 3C–PACS" by Robert W. Brooks published by Computer Control Company, Incorporated, Wesley, Mass.

The output of an R.-F. oscillator 4 comprises one input to each of the And-gates 5 and 6. A multivibrator 3 of conventional construction is employed to provide gating signals of opposite phase respectively as a second input to each of the And-gates 5 and 6. That is, the gating signal applied by multivibrator 3 to the And-gate 5 will occur alternately in time sequence with respect to the gating signal applied by multivibrator 3 to the And-gate 6. Accordingly, each of the And-gates 5 and 6 will act essentially as a switching device for alternately energizing the lines 1 and 2. In this manner the alternate switching diodes $S_{(n+1)}$, $S_{(n+3)}$ etc. which for convenience are labeled in Fig. 1 as the "upper level" switching diodes are each influenced by the R.-F. signal in alternate time sequence to the switching diodes $S_{(n+2)}$, $S_{(n+4)}$, etc. in the designated "lower level." By-pass capacitors C1 and C2 are provided connecting each signal electrode of the switching diodes S to ground.

For purposes of illustration, the indicator diodes M may have a striking potential of 150 volts and a maintaining potential of 75 volts. Assuming first that all the M diodes are off, then all the signal electrode terminals of the M diodes will be at zero volts and no current will flow through the switching diodes S. This condition represents the state of all the M diodes beyond the one immediately following the last energized M diode. Assume that one of the previous stage diodes, $M_n$, has been energized. Then signal electrode terminal of diode $M_n$ in stage $n$ will be at 140—75 which equals +65 volts. If the application of a pulse input to multivibrator 3 has resulted in the R.-F line 1 being energized, switching diode $S_{(n+1)}$ of stage $n+1$ will be rendered conducting by the application of an R.-F. ionizing bias thereto by means of the sleeve E. The potential at electrode terminal $P_n$ will be transmitted to electrode $P_{(n+1)}$ of stage $n+1$ through the switching diode $S_{(n+1)}$ and the resistor R1. The resulting voltages established across the indicating diode $M_{(n+1)}$ will therefore be approximately $+65-(-140)=205$ volts. The storage-indicator diode $M_{(n+1)}$ will therefore conduct and the voltage at the electrode terminal $P_{(n+1)}$ will immediately drop to $75-140=-65$ volts, changing the potential across the referred-to switching diode $S_{(n+1)}$ to $+65-(-65)=130$ volts. Whether the reduction in potential across the diode $S_{(n+1)}$ is sufficient to extinguish such switching diode is immaterial. Even should such switching tube remain on following energization of the R.-F. line 1 there is no deleterious effect other than the added load to the bias power supply. R.-F. line 1 need be energized for an interval sufficient only to insure that storage-diode $M_{(n+1)}$ has assumed the conducting state, but may remain energized until the next input pulse is applied.

Recalling that the R.-F. line 2 is not energized, then the switching tube $S_{(n+2)}$ of the subsequent $n+2$ stage is nonconducting and nothing further occurs, the circuit remains in the stable condition described above and one count has been added to the register. The application of a second pulse to be counted to the multivibrator 3 results in the energization of R.-F. line 2 and the application of an R.-F. field through the sleeves E to each of the lower-level switching tubes $S_{(n+2)}$, $S_{(n+4)}$ etc. The R.-F. field is strong enough to ionize the gas in these tubes and render them conducting. Under such conditions of operation, the lower-level switching diode $S_{(n+2)}$ transmits the —65 volt potential existing at signal electrode terminal $P_{(n+1)}$ to signal electrode terminals $P_{(n+2)}$ of indicator diode $M_{(n+2)}$ in the subsequent $n+2$ stage. Accordingly a voltage of 205 volts is established across the indicating diode $M_{(n+2)}$ in a manner similar to that described in connection with the diode $M_{(n+1)}$ and the indicator diode $M_{(n+2)}$ of the subsequent $n+2$ stage is thereby energized.

In this manner as the R.-F. lines 1 and 2 are alternately excited in sequence consonant with each applied pulse, each stage of the step-by-step circuit is energized or subject to a stage change in succession.

Resetting is accomplished by lowering the bias potential on the indicator-storage diode M. For this purpose a normally open switch $S_w$ may be employed for connecting the bias terminals to ground through a resistor R4 as indicated in Fig. 1. A similar resetting switch is provided in the negative bias supply as shown on dotted lines in Fig. 1.

In order to insure uniformity of count-registration, it is necessary that the first-stage indicator-storage diode such as diode $M_n$ be in a conducting state before a counting sequence begins. For this purpose, the input electrode of the switching diode in the first stage (i.e. the $S_n$ state diode) preceding storage-diode $M_n$ is connected to a bias potential which may be derived from the negative (—140 volt) bias source through a voltage divider R3, as indicated in Fig. 1. The amplitude of such bias potential is approximately —65 volts and in effect simulates the output level of an indicator-storage diode, enabling the functioning of the circuit in the described manner.

The storage-indicator diodes M according to the invention as described are integral components of each circuit stage. That is, in addition to their indicating and storage or memory functions, the state or condition of energization of each stage is determined by the corresponding state or condition of each such diode. The signals available at the terminals $P_n$, $P_{(n+1)}$ etc., can therefore be used as a pulse source or to perform a control function.

It will be apparent that the embodiments shown are only exemplary and that various modifications can be made within the scope of invention as defined in the appended claims.

What is claimed is:

1. A step-by-step pulse counting circuit comprising a plurality of like stages connected in cascade, each stage having an energizable indicator-storage means and voltage switching means, said indicator means comprising a gaseous diode, said switching means comprising a gaseous diode and auxiliary means for applying an R.-F. field thereto, grounded biasing potential sources of opposite polarity, one electrode of the indicator diode in adjacent stages being connected respectively to said grounded biasing potential sources, each of said biasing potentials having an amplitude less than the striking potential and greater than the maintaining potential of said indicator-storage diodes, the other of said indicator-diode electrodes being directly connected to a first electrode of the switching diode in the adjacent subsequent stage, a first current limiting resistor connecting the second electrode of said swiching diode in each stage to said other electrode of the indicator-diode in the same stage, a second resistor connecting said second electrode of said switching diode to ground potential, separate energizable R.-F. means connected respectively to the auxiliary R.-F. applying means of a switching diode in adjacent stages for applying an R.-F. energy potential thereto, an input for applying pulses to be counted and means connected to said input and responsive to the pulses to be counted for alternately energizing each of said energizable R.-F. means in sequence consonant with the sequence of application of said pulses.

2. The invention of claim 1 in which the means for energizing each of said R.-F. means in sequence comprises an oscillator and switching means responsive to the pulses to be counted for connecting the oscillator to each of said R.-F. means in sequence, said switching means comprising a bistable device adapted to be energized to alternate states of conduction by said applied pulses, an And-gate connected to each of said energizable R.-F. means and means connecting opposite outputs of said bistable device to each of said And-gates, respectively.

References Cited in the file of this patent

UNITED STATES PATENTS

| | | |
|---|---|---|
| 2,252,189 | Langer | Aug. 12, 1941 |
| 2,630,550 | Geohegan | Mar. 3, 1953 |
| 2,730,655 | Geisler | Jan. 10, 1956 |
| 2,765,426 | Faulkner | Oct. 2, 1956 |